(12) United States Patent
Majhi et al.

(10) Patent No.: US 7,777,282 B2
(45) Date of Patent: Aug. 17, 2010

(54) SELF-ALIGNED TUNNELING POCKET IN FIELD-EFFECT TRANSISTORS AND PROCESSES TO FORM SAME

(75) Inventors: Prashant Majhi, Austin, TX (US); Wilman Tsai, Saratoga, CA (US); Jack Kavalieros, Portland, OR (US); Ravi Pillarisetty, Portland, OR (US); Benjamin Chu-Kung, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 31 days.

(21) Appl. No.: 12/228,457

(22) Filed: Aug. 13, 2008

(65) Prior Publication Data

US 2010/0038713 A1 Feb. 18, 2010

(51) Int. Cl.
*H01L 29/76* (2006.01)
*H01L 29/94* (2006.01)
(52) U.S. Cl. ................. 257/401; 257/404; 257/E29.179
(58) Field of Classification Search ................. 257/401, 257/404, E29.179
See application file for complete search history.

(56) References Cited

U.S. PATENT DOCUMENTS

| 5,501,996 | A  | * | 3/1996 | Yang et al. | 438/259 |
| 6,348,711 | B1 | * | 2/2002 | Eitan | 257/316 |
| 6,437,406 | B1 | * | 8/2002 | Lee | 257/349 |
| 6,605,845 | B1 | * | 8/2003 | Liang | 257/368 |
| 6,660,605 | B1 | * | 12/2003 | Liu | 438/307 |
| 6,690,060 | B2 | * | 2/2004 | Horiuchi et al. | 257/327 |
| 6,797,576 | B1 | * | 9/2004 | Teng et al. | 438/305 |
| 6,806,517 | B2 | * | 10/2004 | Kim et al. | 257/204 |
| 7,038,270 | B2 | * | 5/2006 | Yoo et al. | 257/324 |
| 7,151,292 | B1 | * | 12/2006 | Wong | 257/314 |
| 7,176,530 | B1 | * | 2/2007 | Bulucea et al. | 257/369 |
| 7,465,976 | B2 | * | 12/2008 | Kavalieros et al. | 257/213 |
| 7,534,688 | B2 | * | 5/2009 | Yoo et al. | 438/288 |
| 7,678,674 | B1 | * | 3/2010 | Sinha et al. | 438/529 |
| 7,683,426 | B2 | * | 3/2010 | Williams et al. | 257/335 |

* cited by examiner

*Primary Examiner*—Ngan Ngo
(74) *Attorney, Agent, or Firm*—John N. Greaves

(57) ABSTRACT

A microelectronic device includes a tunneling pocket within an asymmetrical semiconductive body including source- and drain wells. The tunneling pocket is formed by a self-aligned process by removing a dummy gate electrode from a gate spacer and by implanting the tunneling pocket into the semiconductive body or into an epitaxial film that is part of the semiconductive body.

31 Claims, 9 Drawing Sheets

SELF-ALIGNED TUNNELING POCKET IN FIELD-EFFECT TRANSISTORS AND PROCESSES TO FORM SAME

TECHNICAL FIELD

Disclosed embodiments relate to semiconductive devices and processes of making them.

BACKGROUND

The sizes of the microelectronic devices and other active and passive electrical components are continuously scaled down in attempts to increase device integrated-circuit density. Field-effect transistors are fabricated to provide logic and data-processing functions, among others, for the microelectronic devices built on a wafer. Typically, lithography techniques are used to define the sizes of the field-effect transistors in the devices. As the size of the microelectronic devices are scaled down, process challenges may increase.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Reference will now be made to the drawings wherein like structures may be provided with like suffix reference designations. In order to show the structures of various invention embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings may show only the structures that are most useful to understand the illustrated embodiments. Additional structures known in the art may have not been included to maintain the clarity of the drawings.

Reference throughout this disclosure to "one embodiment" or "an embodiment" means that a particular feature, structure, or characteristic described in connection with the embodiment is included in at least one embodiment of a disclosed invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Figure 1:
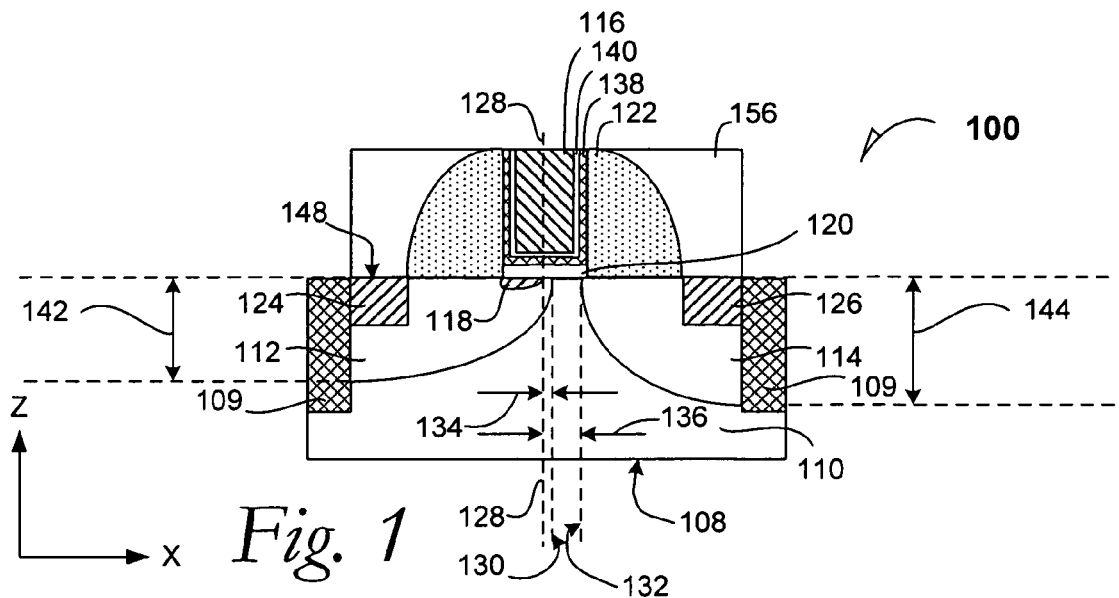
FIG. 1 is a cross-section elevation of a tunnel field-effect transistor according to an example embodiment.

FIG. 1 is a cross-section elevation of a tunnel field-effect transistor (FET) 100 according to an example embodiment. A semiconductive body 110 is configured with an asymmetrical source- and drain well including a N+ first well 112 and a P+ second well 114. In an embodiment, the semiconductive body 110 is a P− semiconductive body. In an embodiment, the semiconductive body 110 is an intrinsic semiconductive body.

A gate electrode 116 is disposed above the semiconductive body 110 and a P+ tunneling pocket 118 is embedded in the N+ first well 112. The gate electrode 116 is disposed above a gate dielectric layer 120 and the gate electrode 116 is embedded within a gate spacer 122. The gate spacer 122 is further embedded within a interlayer dielectric (ILD) 156. Electronic communication to the tunnel FET 100 is accomplished with a self-aligned silicide (salicide) first contact pad 124 and a salicide second contact pad 126. In an embodiment, the semiconductive body 110 is electrically isolated within a larger bulk of a semiconductive substrate by a shallow trench isolation (STI) 109 structure. In an embodiment, the STI 109 is disposed laterally to the salicide first contact pad 124 and the salicide second contact pad 126.

In an embodiment, the semiconductive body 110 is part of a semiconductor-on-insulator (SOI) structure, where the bottom margin 108 represents the location of a dielectric material such as an implanted oxide layer. In an embodiment, the semiconductive body 110 is part of a fin-shaped prominence for the formation of a fin field-effect transistor (fin FET), where the bottom margin 108 represents the location of the beginning of the prominence of the semiconductive body 110 as it extends from a larger bulk of a semiconductive substrate.

The gate electrode 116 is further defined by a symmetry line 128 that defines a bi-lateral symmetry in the X-dimension. In an embodiment, the N+ first well 112 has a channel first boundary 130 that is to the right of the symmetry line 128, and the P+ second well 114 has a channel second boundary 132 that is also to the right of the symmetry line 128. Consequently, an asymmetrical N+ and P+ well configuration exists below the gate electrode 116.

The asymmetrical configuration may be described qualitatively as a P+, P−, N+ (PPN) semiconductive body, or a P+, intrinsic semiconductor, N+ (PIN) semiconductive body.

The asymmetrical configuration may be described quantitatively in one way by noting that a distance 134 between the channel first boundary 130 and the symmetry line 128 is different from a distance 136 between the channel second boundary 132 and the symmetry line 128. In an embodiment, the channel first boundary 130 is not to the right of the symmetry line 128 (FIG. 1b), but the distance 134 between the channel first boundary 130 and the symmetry line 128 remains different from a distance 136 between the channel second boundary 132 and the symmetry line.

Figure 1A:
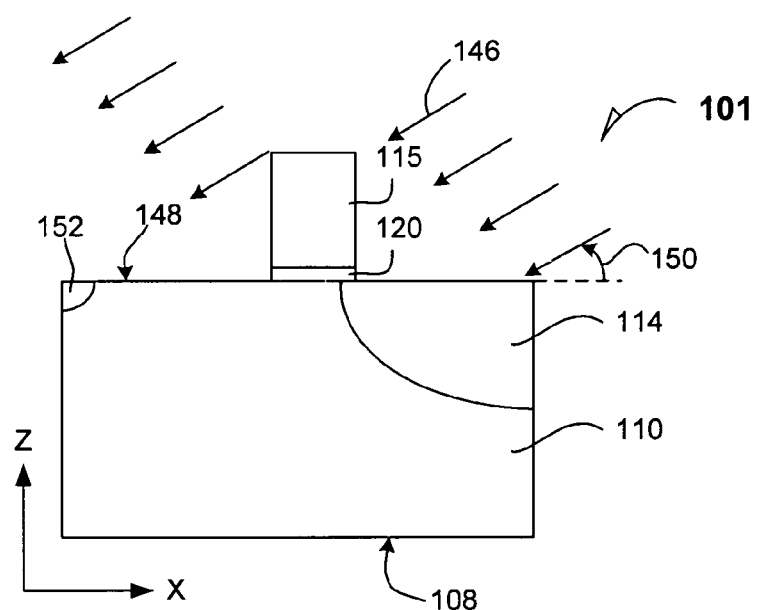
FIG. 1a is a cross-section elevation of the tunnel field-effect transistor depicted in FIG. 1 during processing according to an embodiment.

The asymmetrical N+ and P+ well configuration may also be described quantitatively in an embodiment by noting that the N+ well 112 has a well first depth 142 and the P+ well 114 has a well second depth 144. The first depth 142 and the second depth 144 are not equal. In an embodiment, the gate electrode 116 is embedded in the gate spacer 122 with a high dielectric constant (high-k) first liner 138 that is formed by atomic layer-deposited (ALD). Further, the high-k first liner 138 holds metal second liner 140 that is also formed by ALD. FIG. 1a is a cross-section elevation of the tunnel field-effect transistor depicted in FIG. 1 during processing according to an embodiment. The tunnel FET 101 is being processed such that a dummy gate electrode 115 is being used as a shadow mask during an angled implantation of the P+ second well 114.

The dummy gate electrode 115 rests upon the gate dielectric layer 120. In an embodiment, the gate dielectric layer 120 has an effective oxide thickness (EOT) from about 7 Angstrom (Å) to about 9 Å. In an embodiment, the gate dielectric layer 120 includes silicon dioxide ($SiO_2$). In an embodiment, the gate dielectric includes silicon oxynitride ($SiO_xN_y$). In an embodiment, the gate dielectric layer 120 includes silicon nitride ($Si_3N_4$). In an embodiment, the gate dielectric layer 120 includes any two of the above given gate dielectrics. In an embodiment, the gate dielectric layer 120 includes an oxide of a metal that has a dielectric constant k higher than the dielectric constant of $SiO_2$. Examples for such oxides may include zirconium oxide ($ZrO_2$), hafnium oxide ($HFO_2$), and lanthanum oxide ($La_2O_4$). The gate dielectric layer 120 may be formed using any conventional technique that is known to one of ordinary skill in the art of microelectronic device manufacturing, for example, using any suitable spinning-on, chemical vapor deposition (CVD), or physical vapor deposition (PVD, also known as sputtering) technique.

Angled implantation is indicated by directional arrows 146 that are impinging the tunnel FET 101 from right-to-left as illustrated. The directional arrows 146 impinge the upper surface 148 at a P+ implantation angle 150. In an embodiment, some P+ implantation material may impinge on the upper surface 148 of the semiconductive body 110 on the side opposite intended to form an exposure profile 152.

Figure 1B:
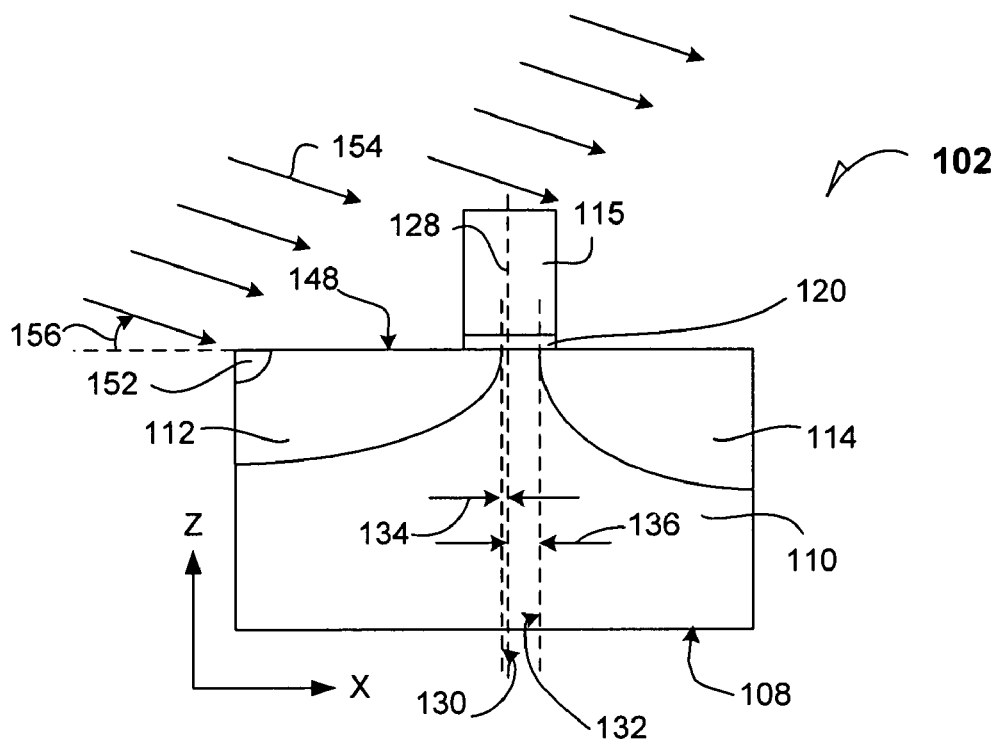
FIG. 1b is a cross-section elevation of the tunnel field-effect transistor depicted in FIG. 1a after further processing according to an embodiment.

FIG. 1b is a cross-section elevation of the tunnel field-effect transistor depicted in FIG. 1a after further processing according to an embodiment. The tunnel FET 102 is being angle-implanted by directional arrows 154 that impinge the upper surface 148 at an N+ implantation angle 156. In an embodiment, the P+ implantation angle 150 (FIG. 1a) is different from the N+ implantation angle 154. The different implantation angles are one method to obtain the well asymmetry. It can be seen in FIG. 1b that the channel first boundary 130 is not to the right of the symmetry line 128, but a distance 134 between the channel first boundary 130 and the symmetry line 128 remains different from a distance 136 between the channel second boundary 132 and the symmetry line 128. Processing may cause the channel boundaries to move somewhat such as by thermal diffusion.

Figure 1C:
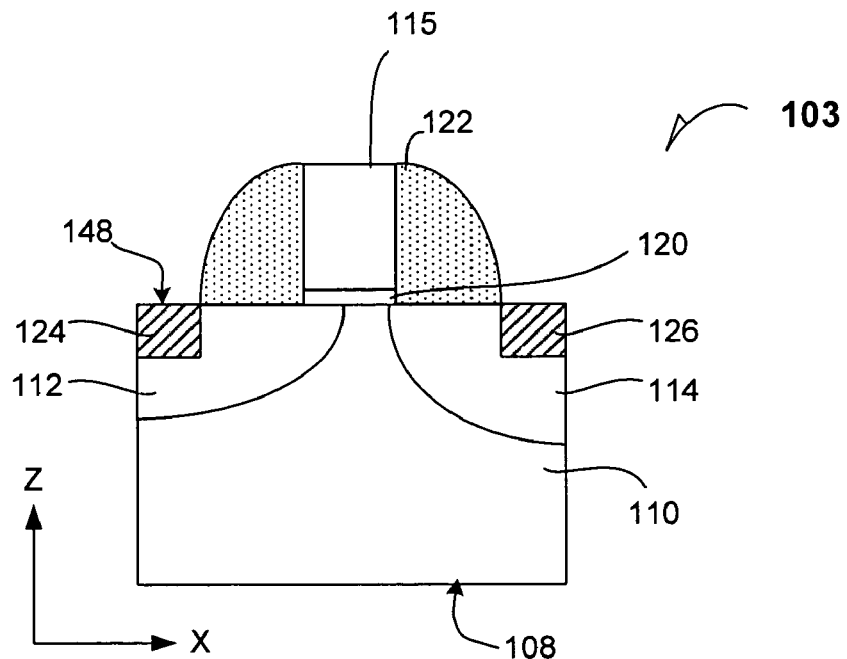
FIG. 1c is a cross-section elevation of the tunnel field-effect transistor depicted in FIG. 1b after further processing according to an embodiment.

FIG. 1c is a cross-section elevation of the tunnel field-effect transistor depicted in FIG. 1b after further processing according to an embodiment. The tunnel FET 103 has been processed to form the gate spacer 122, and a salicidation process has been accomplished to form the salicide first contact pad 124 and salicide second contact pad 126. In an embodiment, further processing includes over-etching to remove some or all of the exposure profile 152 as depicted in FIG. 1a. In an embodiment, the STI 109 (see FIG. 1) is placed where the exposure profile 152 is shown in order to displace the exposure profile 152, as well as to isolate the semiconductive body 110.

Figure 1D:
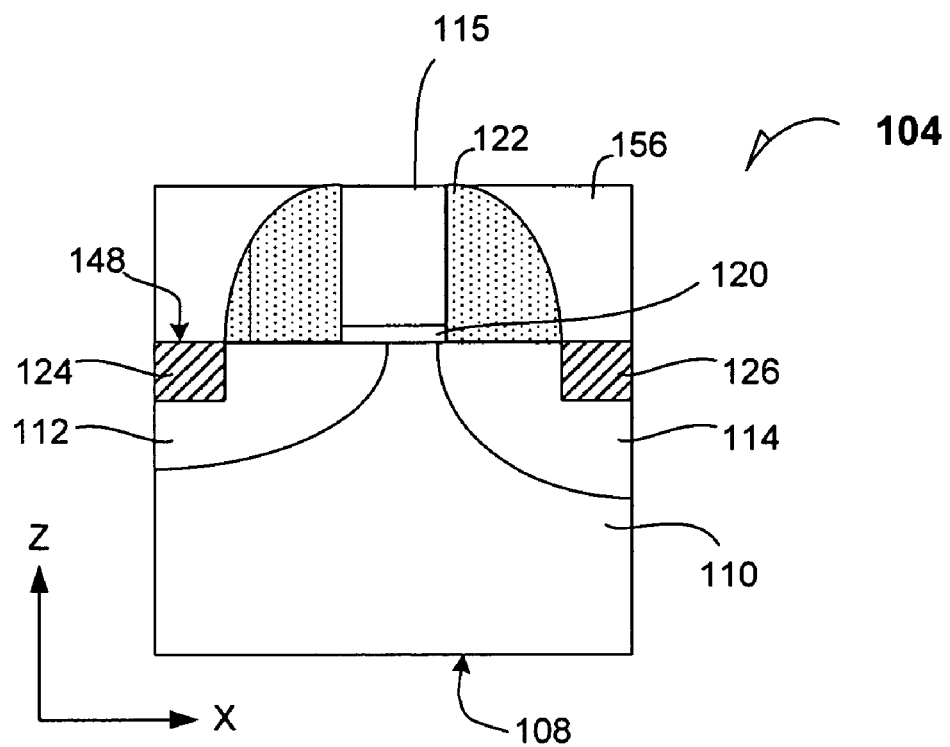
FIG. 1d is a cross-section elevation of the tunnel field-effect transistor depicted in FIG. 1c after further processing according to an embodiment.

FIG. 1d is a cross-section elevation of the tunnel field-effect transistor depicted in FIG. 1c after further processing according to an embodiment. The tunnel FET 104 has been blanket deposited with an interlayer dielectric (ILD) layer 156 that has also been planarized according to known technique.

Figure 1E:
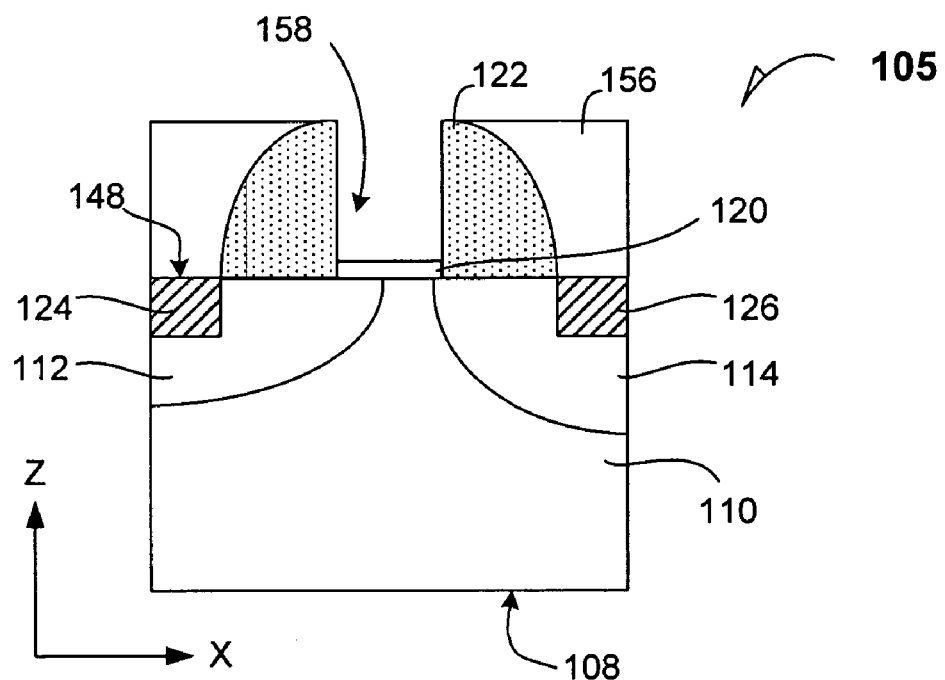
FIG. 1e is a cross-section elevation of the tunnel field-effect transistor depicted in FIG. 1d after further processing according to an embodiment.

FIG. 1e is a cross-section elevation of the tunnel field-effect transistor depicted in FIG. 1d after further processing according to an embodiment. The tunnel FET 105 has been wet etched according to an embodiment to remove the dummy gate electrode 115 (FIG. 1d) and to open an electrode recess 158 that has exposed the gate dielectric layer 120.

Figure 1F:
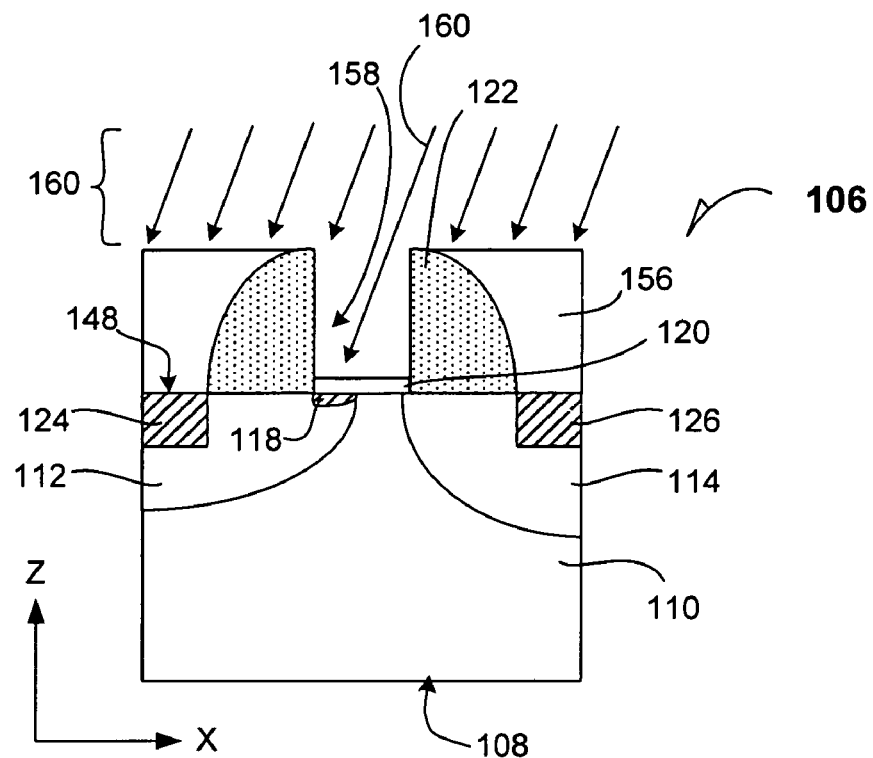
FIG. 1f is a cross-section elevation of the tunnel field-effect transistor depicted in FIG. 1e after further processing according to an embodiment.

FIG. 1f is a cross-section elevation of the tunnel field-effect transistor depicted in FIG. 1e after further processing according to an embodiment. The tunnel FET 106 is being processed with angled implantation within the electrode recess 158 is indicated by directional arrows 160 that are impinging through the gate dielectric layer 120 and that are forming the P+ tunneling pocket 118 within the N+ first well 112 from right-to-left as illustrated. As a consequence, the P+ tunneling pocket 118 within the N+ first well 112 is formed by a self-aligned process.

Reference is again made to FIG. 1. Further processing has resulted in formation of the high-k first liner 138 by ALD processing. In an embodiment, ALD conditions for chemical vapor deposition within the electrode recess 158 are achieved to form the high-k first liner 138 that has an EOT from 7 Å to 9 Å.

Further processing has also resulted in formation of the metal second liner 140 by ALD processing. In an embodiment, the metal second liner 140 is a metal such as titanium that is formed under ALD conditions for chemical vapor deposition. (*I would like here, one of your own selections for the metals of the liner 140 and the gate electrode 116, based upon your knowledge of a given WF and your experience *)

Further processing has also resulted in formation of the metal gate electrode 116. In an embodiment, the metal second liner 140 is selected to facilitate filling of the metal gate electrode 116 into the electrode recess 158. The metal second liner 140 and the metal gate electrode 116 are selected based upon a work function of the tunnel FET 100 for a given application.

After completion of the tunnel FET 100, the tunnel FET 100 may have been fabricated with specific gate length (Lg) and specific current-on (Ion) characteristics depending upon the given application. These characteristics may lead to more effective tunneling by selected characteristics of the P+ tunneling pocket 118 such as overall volume, length, depth, doping concentration, and relative position within the semiconductive body 110 among others.

In general, semiconductive body 110 of the tunnel FET 100 may be any semiconductor material to make a variety of integrated circuits including passive and active devices. Other embodiments for semiconductive material for the semiconductive body 110 may use combined semiconductors, for example, indium phosphide, gallium arsenide, gallium nitride, silicon germanium, and silicon carbide.

In an embodiment, the semiconductive body 110 comprises any material, e.g., SOI, gallium arsenide (GaAs), germanium (Ge), or SiGe. In an embodiment, the transistor is coupled to one or more metallization layers of integrated circuits having active and passive devices, such as transistors, switches, optoelectronic devices, capacitors, resistors, and interconnects. The one or more metallization layers of integrated circuits are separated from adjacent metallization layers by dielectric material such as interlayer dielectric layers (ILD).

In an embodiment, the semiconductive body 110 includes a monocrystalline silicon structure. In an embodiment, the semiconductive body 110 includes a silicon-on-insulator (SOI) structure that may be insulated at the boundary 108. In an embodiment, the semiconductive body 110 is a fin-shaped prominence that extends in the Z-direction away from a larger substrate of semiconductive material at the boundary 108. In an embodiment, the transistor is isolated by structures such as the STI 109.

In an embodiment, the gate electrode 116 is a metal gate such as copper (Cu). In an embodiment, the gate electrode 116 is ruthenium (Ru). In an embodiment, the gate electrode 116 is nickel (Ni). In an embodiment, the gate electrode 116 is cobalt (Co). In an embodiment, the gate electrode 116 is chromium (Cr). In an embodiment, the gate electrode 116 is iron (Fe). In an embodiment, the gate electrode 116 is manganese (Mn). In an embodiment, the gate electrode 116 is titanium (Ti). In an embodiment, the gate electrode 116 is aluminum (Al). In an embodiment, the gate electrode 116 is hafnium (Hf). In an embodiment, the gate electrode 116 is tantalum (Ta). In an embodiment, the gate electrode 116 is tungsten (W). In an embodiment, the gate electrode 116 is vanadium (V). In an embodiment, the gate electrode 116 is molybdenum (Mo). In an embodiment, the gate electrode 116 is palladium (Pd). In an embodiment, the gate electrode 116 is gold (Au). In an embodiment, the gate electrode 116 is silver (Ag). In an embodiment, the gate electrode 116 is platinum (Pt). In an embodiment, the gate electrode 116 is any combination of the given metals.

In an embodiment, to form an n-MOS transistor, the N+ first well 112 is formed with arsenic ions or phosphorus ions with the concentration in the range of $10^{18}$ cm$^{-3}$ to $10^{21}$ cm$^{-3}$. In an embodiment, to form a p-MOS transistor structure, the P+ second well 114 is formed with boron ions having the concentration in the range of $10^{18}$ cm$^{-3}$ to $10^{21}$ cm$^{-3}$.

In an embodiment, the gate spacers 122 are an oxide material. In an embodiment, the gate spacers 122 are a nitride material. In an embodiment, the gate spacers 122 are a combination such as an oxynitride material. In an embodiment, the gate spacers 122 include silicon nitride. Formation of the gate spacers 122 can be done by conventional techniques that are known to one of ordinary skill in the art of microelectronic device manufacturing.

Figure 2:
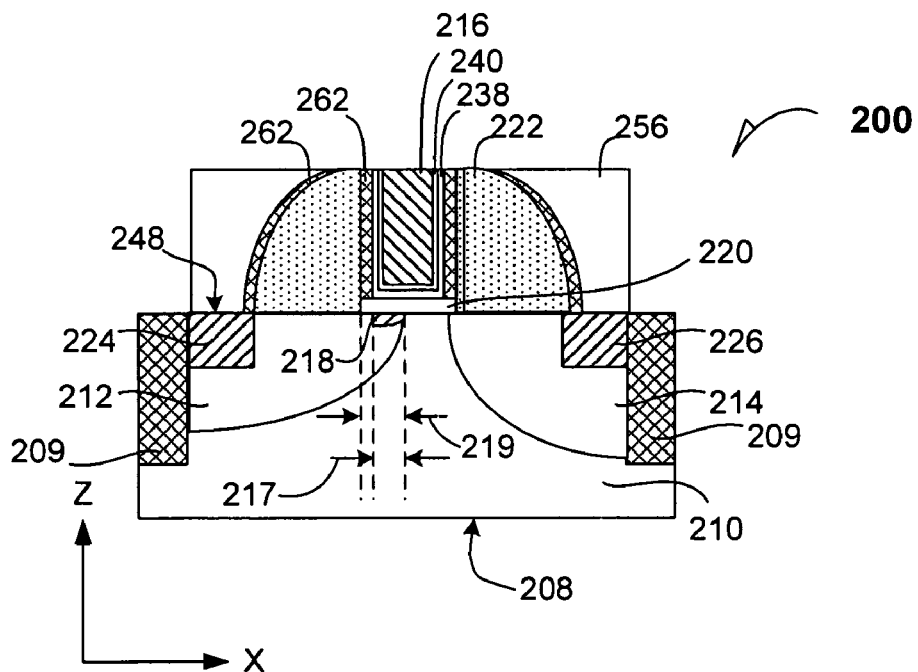
FIG. 2 is a cross-section elevation of a tunnel field-effect transistor according to an example embodiment.

FIG. 2 is a cross-section elevation of a tunnel field-effect transistor 200 according to an example embodiment. A semiconductive body 210 is configured with an asymmetrical source- and drain well including an N+ first well 212 and a P+ second well 214. In an embodiment, the semiconductive body 210 is a P− body. In an embodiment, the semiconductive body 210 is an intrinsic semiconductive body. In an embodiment, the semiconductive body 210 includes an SOI structure that may be insulated at the boundary 208. In an embodiment, the semiconductive body 210 is a fin-shaped prominence that extends in the Z-direction away from a larger substrate of semiconductive material at the boundary 208. In an embodiment, the transistor is isolated by structures such as an STI 209.

A gate electrode 216 is disposed above the semiconductive body 210 and a P+ tunneling pocket 218 is embedded in the N+ first well 212. The gate electrode 216 is disposed above a gate dielectric film 220 that is on the upper surface 248 of the semiconductive body 210. The gate electrode 216 is embedded within a gate spacer 222 that is also on the upper surface 248 of the semiconductive body 210. Electronic communication to the tunnel FET 200 is accomplished with a salicide first contact pad 224 and a salicide second contact pad 226.

The gate electrode 216 is further defined by a gate electrode spacer 262 that is embedded in part within the confines of the gate spacer 222. Further within the gate spacer 222 are located an ALD-formed high-k first liner 238 and an ALD-formed metal second liner 240. Consequent to the presence of the gate electrode spacer 262, the gate electrode 216 may be narrower than that depicted in FIG. 1 all other things being equal. Further to this embodiment, the P+ tunneling pocket 218 may be shorter (along the X-axis) compared to the P+ tunneling pocket 118 depicted in FIG. 1, all other things being equal. As a result of processing with the gate electrode spacer 262 present, more or different control upon a final tunnel FET may be exercised during both processing and operation of the tunnel FET 200 as compared to the tunnel FET 100 depicted in FIG. 1.

Figure 2A:
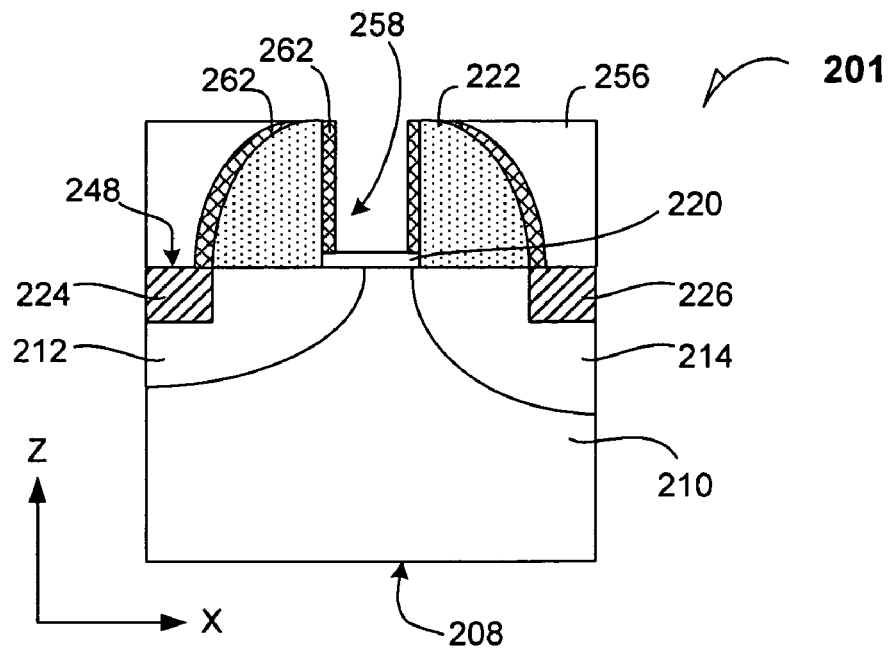
FIG. 2a is a cross-section elevation of the tunnel field-effect transistor depicted in FIG. 2 during processing according to an embodiment.

FIG. 2a is a cross-section elevation of the tunnel field-effect transistor depicted in FIG. 2 during processing according to an embodiment. The tunnel FET 201 has been processed to remove a dummy gate electrode, to open an electrode recess 258, and to expose the gate dielectric layer 220. Further processing is illustrate with formation of the gate electrode spacer 262. The gate electrode spacer 262 may be formed by a blanket deposition after the electrode recess 258 has been opened, followed by a spacer etch. Where masking is not used to form the gate electrode spacer 262, the gate electrode spacer 262 may be layered externally to the gate spacer 222 as well as within the electrode recess 258. Further processing is depicted with the formation of an ILD 256 that embeds the gate spacer 222. In a process embodiment, the electrode recess 258 is filled with a sacrificial material, the ILD 256 is blanket deposited and polished back, and the sacrificial material is removed to re-open the electrode recess 258 as illustrated.

Figure 2B:
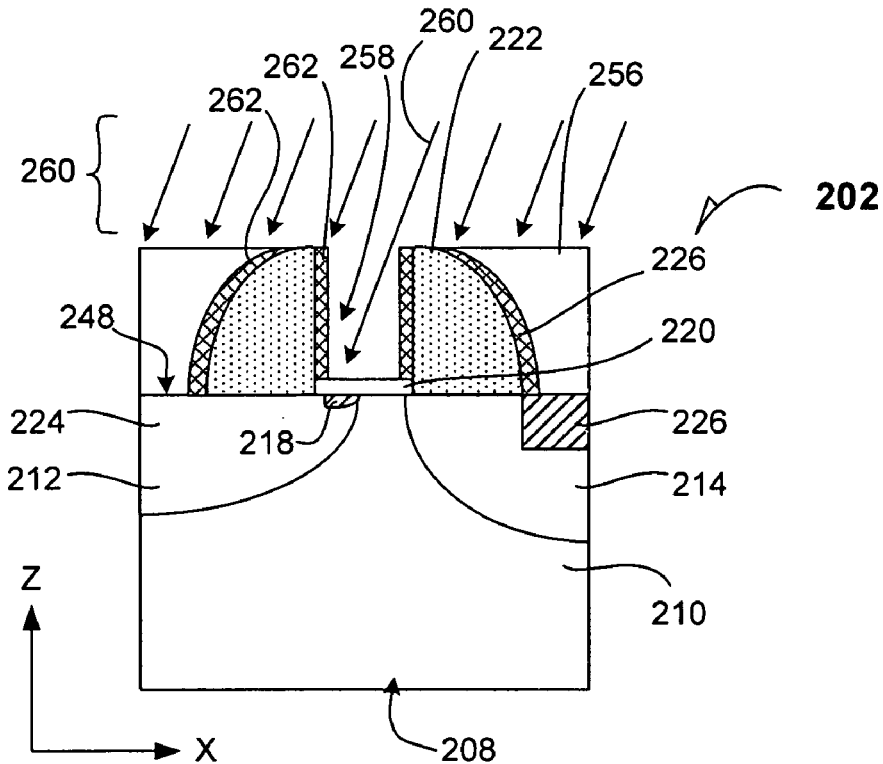
FIG. 2b is a cross-section elevation of the tunnel field-effect transistor depicted in FIG. 2a after further processing according to an embodiment.

FIG. 2b is a cross-section elevation of the tunnel field-effect transistor depicted in FIG. 2a after further processing according to an embodiment. The tunnel FET 202 is being processed with angled implantation within the electrode recess 258 as indicated by directional arrows 260 that are impinging through the gate dielectric layer 220 and that are forming the P+ tunneling pocket 218 within the N+ first well 212 tunnel FET 202 from right-to-left as illustrated. As a consequence, the P+ tunneling pocket 218 within the N+ first well 212 is formed by a self-aligned process.

Reference is again made to FIG. 2. By use of the electrode spacer 262, the P+ tunneling pocket 218 has a shorter length 217 than the length 219 of the P+ tunneling pocket 118 depicted in FIG. 1f, all other things being equal. It can now be seen that the length 217 of the tunneling pocket 118 is affected by the thickness of the gate electrode spacer 262 within the gate electrode recess 258.

Figure 3:
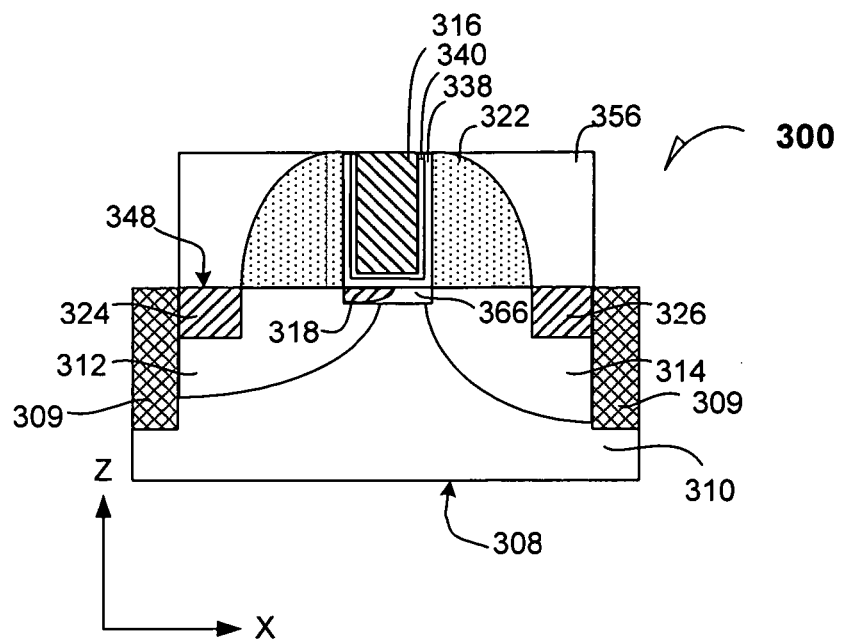
FIG. 3 is a cross-section elevation of a tunnel field-effect transistor according to an example embodiment.

FIG. 3 is a cross-section elevation of a tunnel field-effect transistor 300 according to an example embodiment. A semiconductive body 310 is configured with an asymmetrical source- and drain well including an N+ first well 312 and a P+ second well 314. In an embodiment, the semiconductive body 310 is a P− body. In an embodiment, the semiconductive body 310 is an intrinsic semiconductive body. In an embodiment, the semiconductive body 310 includes an SOI structure that may be insulated at the boundary 308. In an embodiment, the semiconductive body 310 is a fin-shaped prominence that extends in the Z-direction away from a larger substrate of semiconductive material at the boundary 308. In an embodiment, the transistor is isolated by structures such as an STI 309.

A gate electrode 316 is disposed above the semiconductive body 310 and a P+ tunneling pocket 318 is embedded in the N+ first well 312 within an epitaxial film 366 on the semiconductive body 310. To enhance tunneling according to an embodiment, the epitaxial film 366 is an SiGe material and the semiconductive body 310 is a P− doped silicon, relative to the source- and drain wells 312 and 314 according to an embodiment. In an embodiment, the epitaxial film 366 is an SiGe material and the semiconductive body 310 is an intrinsic silicon, relative to the source- and drain wells 312 and 314.

In an embodiment, the epitaxial film 366 is grown to match the same level and therefore to be coplanar to the upper surface 348. In an embodiment, the epitaxial film 366 is grown to extend above the upper surface 348. In an embodiment, the epitaxial film 366 is grown to reach below the upper surface 348.

The gate electrode 316 is disposed in a gate spacer 322 with an ALD-formed high-k first liner 338 that acts also as the gate dielectric layer. Further in an embodiment, the high-k first liner 338 has an EOT from 7 Å to 9 Å, and it holds an ALD metal second liner 340. Electronic communication to the tunnel FET 310 is accomplished with a salicide first contact pad 324 and a salicide second contact pad 326.

Figure 3A:
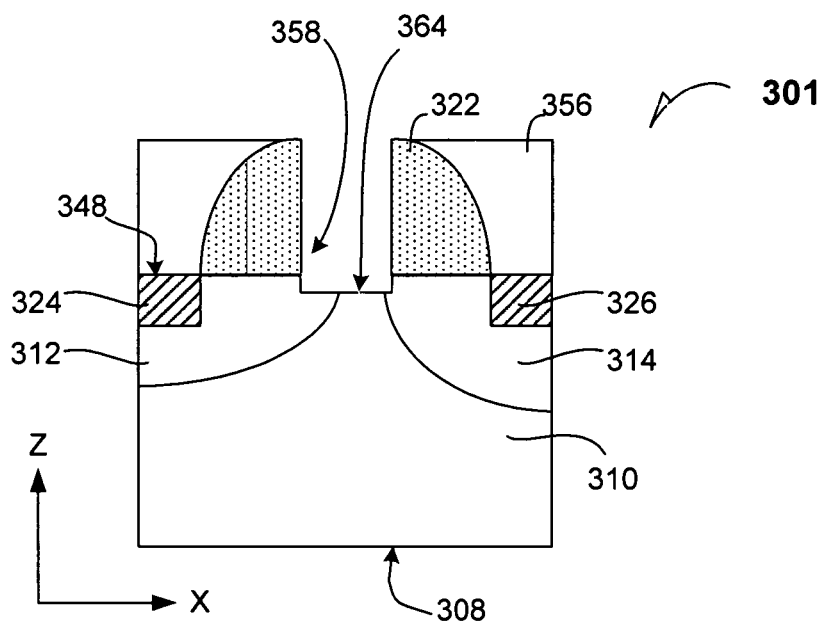
FIG. 3a is a cross-section elevation of the tunnel field-effect transistor depicted in FIG. 3 during processing according to an embodiment.

FIG. 3a is a cross-section elevation of the tunnel field-effect transistor depicted in FIG. 3 during processing according to an embodiment. The tunnel FET 310 has been processed similarly to the tunnel FET 105 depicted in FIG. 1e. The dummy gate electrode (not pictured) has been removed and a directional etch has opened an electrode recess 358 that has etched into the semiconductive body 310 by breaching the upper surface 348 within the electrode recess 358. Consequently an electrode recess floor 364 is formed in the semiconductive body 310 and any gate dielectric layer, if present, has been removed from the electrode recess 358.

Figure 3B:
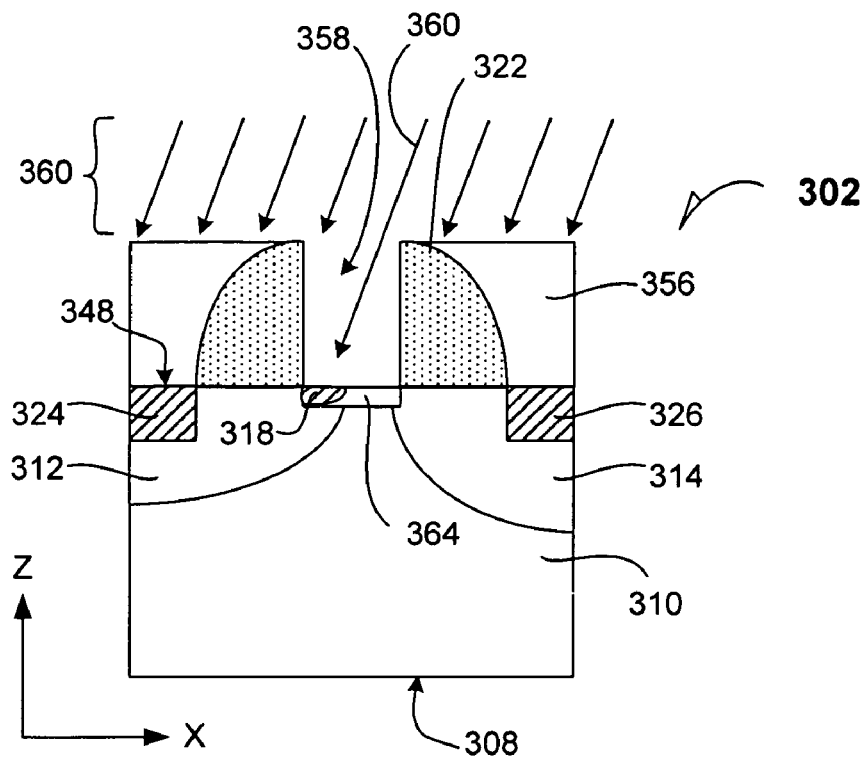
FIG. 3b is a cross-section elevation of the tunnel field-effect transistor depicted in FIG. 3a during processing according to an embodiment.

FIG. 3b is a cross-section elevation of the tunnel field-effect transistor depicted in FIG. 3a during processing according to an embodiment. The tunnel FET 302 is processed with the growth of the epitaxial film 366, and angled implantation is being carried out within the electrode recess 358 as indicated by directional arrows 360. The implantation is shown impinging into the epitaxial film 366 and to be forming the P+ tunneling pocket 318 within the N+ first well 312 tunnel FET 202. As a consequence, the P+ tunneling pocket 318 within the N+ first well 312 is formed by a self-aligned process.

Reference is again made to FIG. 3. By use of the epitaxial film 366, the P+ tunneling pocket 318 may be configured within the epitaxial film 364 to achieve a given configuration based upon the work function requirements of the metal gate electrode 316. In an embodiment, the epitaxial film 366 doping is different from the bulk semiconductive material of the semiconductive body 310. To enhance tunneling according to an embodiment, the epitaxial film 366 is an SiGe material and the semiconductive body 310 is a P− doped silicon, relative to the source- and drain wells 312 and 314 according to an embodiment. In an embodiment, the epitaxial film 366 is an SiGe material and the semiconductive body 310 is an intrinsic silicon, relative to the source- and drain wells 312 and 314.

Figure 4:
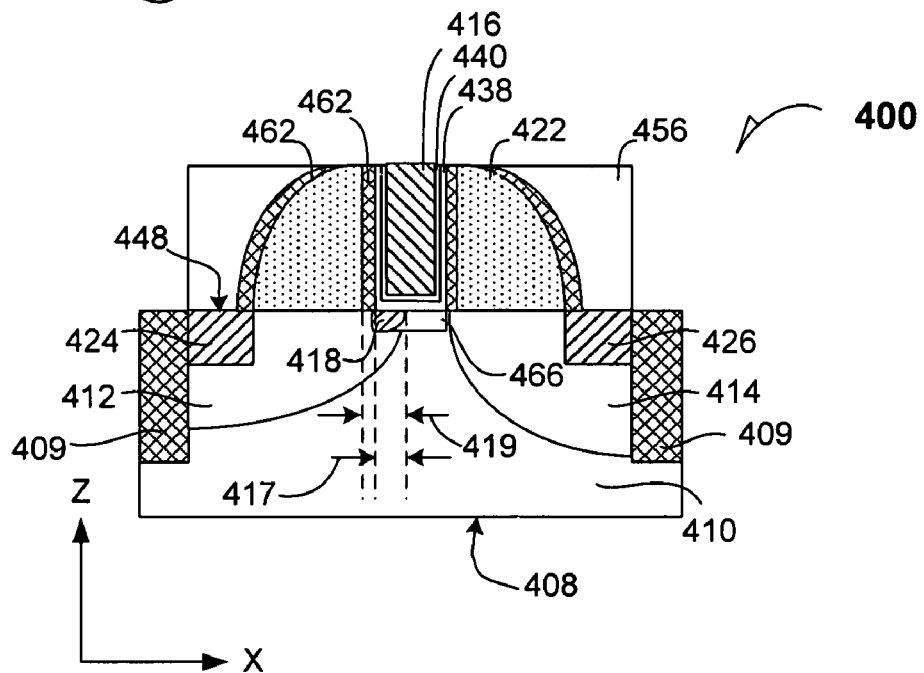
FIG. 4 is a cross-section elevation of a tunnel field-effect transistor according to an example embodiment.

FIG. 4 is a cross-section elevation of a tunnel field-effect transistor 400 according to an example embodiment. A semiconductive body 410 is configured with an asymmetrical source- and drain well including an N+ first well 412 and a P+ second well 414. In an embodiment, the semiconductive body 410 is a P− body. In an embodiment, the semiconductive body 410 is an intrinsic semiconductive body. In an embodiment, the semiconductive body 410 includes an SOI structure that may be insulated at the boundary 408. In an embodiment, the semiconductive body 410 is a fin-shaped prominence that extends in the Z-direction away from a larger substrate of semiconductive material at the boundary 408. In an embodiment, the transistor is isolated by structures such as an STI 409.

A gate electrode 416 is disposed above the semiconductive body 410 and a P+ tunneling pocket 418 is embedded in the N+ first well 412 within an epitaxial film 466. The gate electrode 416 is disposed in a gate spacer 422 with an ALD-formed high-k first liner 438 that acts also as the gate dielectric. Further, the high-k first liner 438 holds an ALD metal second liner 440. Electronic communication to the tunnel FET 410 is accomplished with a salicide first contact pad 424 and a salicide second contact pad 426. It should now be clear that the several embodiments of metal liner and metal gate electrode may be applied to all the disclosed embodiments.

Processing to accomplish the tunnel FET 400 is carried out similarly to that for the tunnel FET 300 depicted in FIG. 3, as well as additional processing for the tunnel FET 200 depicted in FIG. 2. A dummy gate electrode is removed and a directional etch opens an electrode recess that has also etched into the semiconductive body 410 by breaching the upper surface 448 of the semiconductive body 410. Consequently an electrode recess floor is formed in the semiconductive body 410. Thereafter the tunnel FET 400 is processed with the growth of an epitaxial film 466, and angled implantation is carried out within the electrode recess to form the P+ tunneling pocket 418 within the N+ first well 412 tunnel FET 400. As a consequence, the P+ tunneling pocket 418 within the N+ first well 412 is formed by a self-aligned process.

The gate electrode 416 is further defined by a gate electrode spacer 462 that is embedded within the confines of the gate spacer 222 including an ALD-formed high-k first liner 438 and an ALD-formed metal second liner 440. Consequently, the metal gate electrode 416 may be narrower than the gate electrode 316 depicted in FIG. 3, all other things being equal. Further to this embodiment, the length 417 of the P+ tunneling pocket 418 may be shorter (along the X-axis) compared to the length 419 of the P+ tunneling pocket 318 depicted in FIG. 3, all other things being equal. As a result of processing with the gate electrode spacer 462 present, more or different control upon a final tunnel FET may be exercised during both processing and operation of the tunnel FET 400 as compared to the tunnel FET 300 depicted in FIG. 3.

It can now be seen by the several embodiments as described and illustrated, that the tunneling pocket is part of a self-aligned tunnel FET. It can be recognized that an increased on current (Ion) can be achieved by the tunneling pocket as part of the self-aligned tunnel FET. The several structures that are described and illustrated may lead to heterogeneous structures that can be used to control effective band offsets. By use of selected embodiments as described and illustrated, short gate lengths (Lgs) are achievable in this "gate-last" technology. The several structures that are described and illustrated also allow for a flexible control and/or modulation of the tunneling area under the gate electrode. The several structures that are described and illustrated may also allow for a flexible control of the tunneling threshold based upon a selected gate electrode work function.

Figure 5:
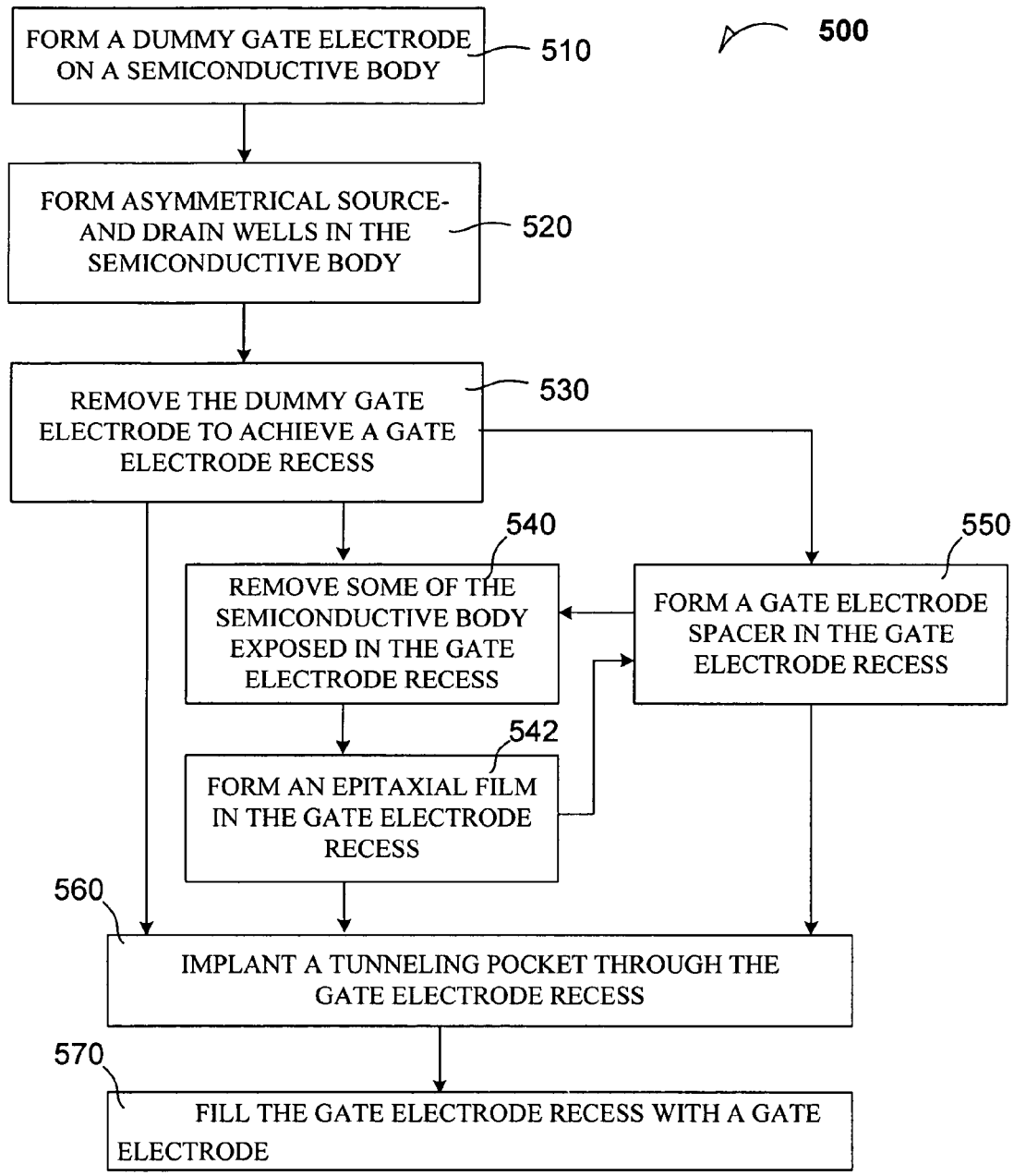
FIG. 5 is a process flow diagram according to an embodiment.

FIG. 5 is a process flow diagram 500 according to an embodiment.

At 510, the process includes forming a dummy gate electrode on a semiconductive body.

At 520, the process includes forming asymmetrical source- and drain wells in the semiconductive body.

At 530, the process includes removing the dummy gate electrode to achieve a gate recess.

At 540, the process includes removing some of the semiconductive body exposed in the gate recess.

At 542, the process includes forming an epitaxial film in the gate recess upon the semiconductive body.

At 550, the process includes forming a gate electrode spacer within the gate electrode recess.

At 560, the process includes implanting a tunneling pocket through the gate electrode recess.

At 570, the process includes filling a gate electrode into the gate electrode recess.

Figure 6:
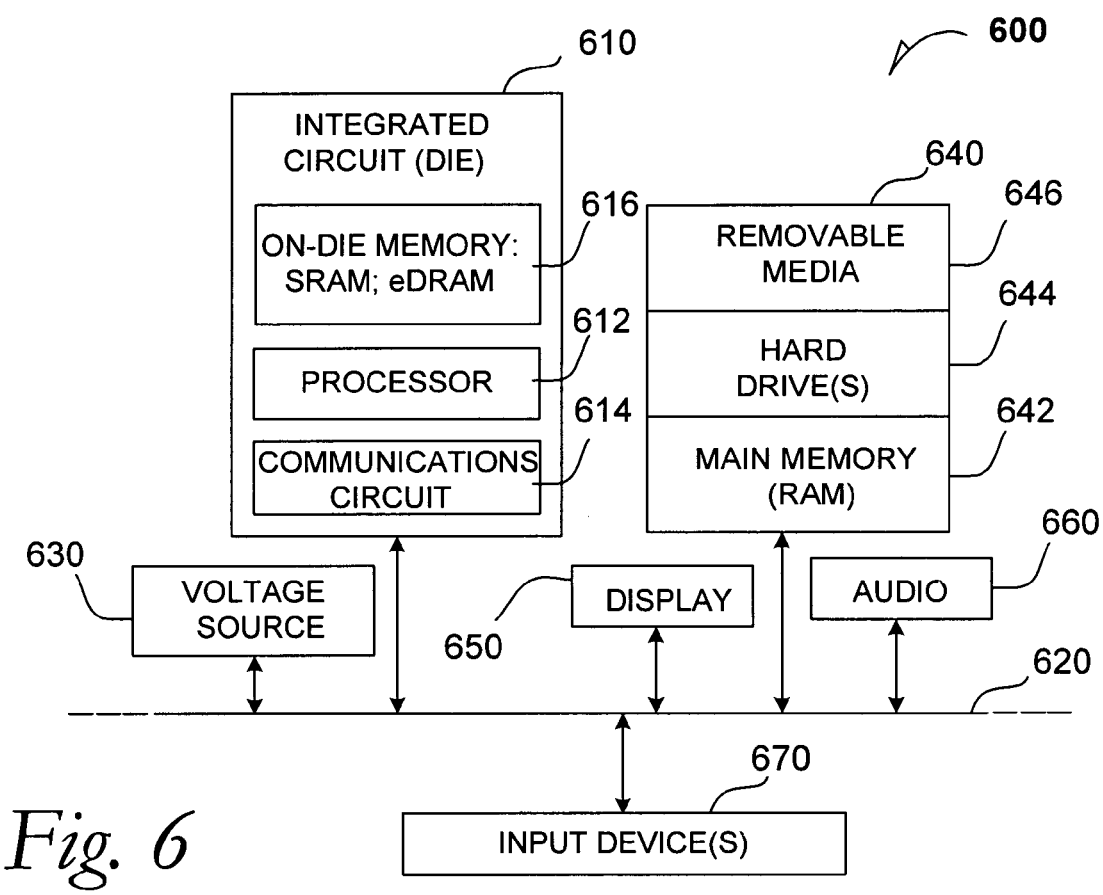
FIG. 6 is a schematic of an electronic system according to an embodiment.

FIG. 6 is a schematic of an electronic system 600 according to an embodiment. The electronic system 600 as depicted can embody a die with a transistor that includes a tunnel FET embodiment as set forth in this disclosure. In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. Other types of circuits that can be included in the integrated circuit 610 are a custom circuit or an application-specific integrated circuit (ASIC), such as a communications circuit 614 for use in wireless devices such as cellular telephones, pagers, portable computers, two-way radios, and similar electronic systems. In an embodiment, the processor 610 includes on-die memory 616 such as static random-access memory (SRAM). In an embodiment, the processor 610 includes on-die memory 616 such as embedded dynamic random-access memory (eDRAM).

In an embodiment, the electronic system 600 also includes an external memory 840 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory keys, and other removable media known in the art.

In an embodiment, the electronic system 600 also includes a display device 650, an audio output 660. In an embodiment, the electronic system 600 includes a controller 670, such as a keyboard, mouse, trackball, game controller, microphone, voice-recognition device, or any other device that inputs information into the electronic system 600.

As shown herein, the integrated circuit 610 can be implemented in a number of different embodiments, including a transistor that includes a tunnel FET embodiment, an electronic system, a computer system, one or more methods of fabricating an integrated circuit, and one or more methods of fabricating an electronic assembly that includes a transistor that includes a tunnel FET embodiment as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A tunnel field-effect transistor, comprising:
  a semiconductive body including source- and drain wells;
  a gate electrode disposed above the semiconductive body, wherein the gate electrode is disposed in a gate electrode recess of a gate spacer;
  a gate electrode spacer disposed within the gate electrode recess; and
  a tunneling pocket disposed in one of the source- and drain wells.

2. The transistor of claim 1, wherein a symmetry line defines the gate electrode, and further including:
  one of the source- and drain wells is a first well including a channel first boundary that has a first distance to the symmetry line; and
  the other of the source- and drain wells is a second well including a channel second boundary that has a second distance to the symmetry line, and wherein the first distance is different from the second distance.

3. The transistor of claim 1, wherein a symmetry line defines the gate electrode, and further including:
  one of the source- and drain wells is an N+ first well including a channel first boundary that is to the right of the symmetry line; and
  the other of the source- and drain wells is a P+ second well including a channel second boundary that is also to the right of the symmetry line.

4. The transistor of claim 1, wherein a symmetry line defines the gate electrode, and further including:
one of the source- and drain wells is an N+ first well including a channel first boundary that is to the right of the symmetry line, and wherein the tunneling pocket is a P+ body disposed in the N+ first well; and
the other of the source- and drain wells is a P+ second well has including a channel second boundary that is also to the right of the symmetry line.

5. The transistor of claim 1, wherein a symmetry line defines the gate electrode, and further including:
one of the source- and drain wells is an N+ first well including a channel first boundary that is to the left of the symmetry line; and
the other of the source- and drain wells is a P+ second well including a channel second boundary that is to the right of the symmetry line.

6. The transistor of claim 1, wherein a symmetry line defines the gate electrode, and further including:
one of the source- and drain wells is an N+ first well including a channel first boundary that is to the left of the symmetry line, and wherein the tunneling pocket is a P+ body disposed in the N+ first well; and
the other of the source- and drain wells is a P+ second well including a channel second boundary that is to the right of the symmetry line.

7. The transistor of claim 1, wherein the tunneling pocket has a length, and wherein the length of the tunneling pocket is affected by the presence of the gate electrode spacer disposed within the gate electrode recess.

8. The transistor of claim 1, wherein the gate electrode is a metal, the transistor further including:
a dielectric first liner disposed in the gate electrode recess; and
a metal second liner disposed in the gate electrode recess, wherein the dielectric first liner holds the metal second liner, and wherein metal second liner holds the gate electrode.

9. A tunnel field-effect transistor, comprising:
a semiconductive body including source- and drain wells;
a gate electrode disposed above the semiconductive body;
an epitaxial film disposed below the gate electrode and on the semiconductive body; and
a tunneling pocket disposed in the epitaxial film.

10. The transistor of claim 9, wherein the semiconductive body includes an upper surface and wherein the epitaxial film extends above the upper surface.

11. The transistor of claim 9, wherein the semiconductive body includes an upper surface and wherein the epitaxial film extends coplanar to the upper surface.

12. The transistor of claim 9, wherein the semiconductive body includes an upper surface and wherein the epitaxial film extends below the upper surface.

13. The transistor of claim 9, further including a gate electrode spacer disposed within the gate electrode recess.

14. The transistor of claim 9, wherein the gate electrode is a metal, the transistor further including:
a dielectric first liner disposed in the gate electrode recess; and
a metal second liner disposed in the gate electrode recess, wherein the dielectric first liner holds the metal second liner, and wherein metal second liner holds the gate electrode.

15. The transistor of claim 9, wherein a symmetry line defines the gate electrode, and further including:
one of the source- and drain wells is an N+ first well including a channel first boundary that is to the right of the symmetry line; and
the other of the source- and drain wells is a P+ second well has including a channel second boundary that is also to the right of the symmetry line.

16. The transistor of claim 9, wherein a symmetry line defines the gate electrode, and further including:
one of the source- and drain wells is an N+ first well including a channel first boundary that is to the right of the symmetry line, and wherein the tunneling pocket is a P+ body disposed in the N+ first well; and
the other of the source- and drain wells is a P+ second well has including a channel second boundary that is also to the right of the symmetry line.

17. The transistor of claim 9, wherein a symmetry line defines the gate electrode, and further including:
one of the source- and drain wells is an N+ first well including a channel first boundary that is to the left of the symmetry line; and
the other of the source- and drain wells is a P+ second well including a channel second boundary that is to the right of the symmetry line.

18. The transistor of claim 9, wherein a symmetry line defines the gate electrode, and further including:
one of the source- and drain wells is an N+ first well including a channel first boundary that is to the left of the symmetry line, and wherein the tunneling pocket is a P+ body disposed in the N+ first well; and
the other of the source- and drain wells is a P+ second well including a channel second boundary that is to the right of the symmetry line.

19. The transistor of claim 9, wherein the tunneling pocket has a length, and wherein the length of the tunneling pocket is affected by the presence of the gate electrode spacer disposed within the gate electrode recess.

20. A computing system comprising:
a semiconductive body that is part of a microelectronic die, wherein the semiconductive body includes a source- and a drain well;
a gate electrode disposed above the semiconductive body, wherein the gate electrode is disposed in a gate electrode recess of a gate spacer;
a gate electrode spacer disposed within the gate electrode recess; and
a tunneling pocket disposed in one of the source- and drain wells; and
external memory coupled to the microelectronic die.

21. The computing system of claim 20, wherein the computing system is part of one of a cellular telephone, a pager, a portable computer, a desktop computer, and a two-way radio.

22. A computing system comprising:
a semiconductive body that is part of a microelectronic die, wherein the semiconductive body includes a source- and a drain well;
a gate electrode disposed above the semiconductive body;
an epitaxial film disposed below the gate electrode and on the semiconductive body;
a tunneling pocket disposed in the epitaxial film; and
external memory coupled to the microelectronic die.

23. The computing system of claim 22, wherein the computing system is part of one of a cellular telephone, a pager, a portable computer, a desktop computer, and a two-way radio.

24. A tunnel field-effect transistor, comprising:
- a semiconductive body including source- and drain wells, wherein a first well has a well first depth and a second well has a well second depth, and wherein the first depth and the second depth are not equal;
- a gate electrode disposed above the semiconductive body, wherein the gate electrode is disposed in a gate electrode recess of a gate spacer, and wherein a symmetry line defines the gate electrode;
- a gate electrode spacer disposed within the gate electrode recess;
- a tunneling pocket disposed in one of the source- and drain wells;
- wherein one of the source- and drain wells is the first well including a channel first boundary that has a first distance to the symmetry line; and
- the other of the source- and drain wells is the second well including a channel second boundary that has a second distance to the symmetry line, and wherein the first distance is different from the second distance;
- an epitaxial film disposed below the gate electrode and on the semiconductive body; and
- a tunneling pocket disposed in the epitaxial film.

25. The transistor of claim 24, wherein the semiconductive body includes an upper surface and wherein the epitaxial film extends above the upper surface.

26. The transistor of claim 24, wherein the semiconductive body includes an upper surface and wherein the epitaxial film extends coplanar to the upper surface.

27. The transistor of claim 24, wherein the semiconductive body includes an upper surface and wherein the epitaxial film extends below the upper surface.

28. The transistor of claim 24, wherein the tunneling pocket has a length, and wherein the length of the tunneling pocket is affected by the presence of the gate electrode spacer disposed within the gate electrode recess.

29. The transistor of claim 24, wherein the gate electrode is a metal, the transistor further including:
- a dielectric first liner disposed in the gate electrode recess; and
- a metal second liner disposed in the gate electrode recess, wherein the dielectric first liner holds the metal second liner, and wherein metal second liner holds the gate electrode.

30. The transistor of claim 24, further including:
- one of the source- and drain wells is an N+ first well including a channel first boundary that is to the right of the symmetry line, and wherein the tunneling pocket is a P+body disposed in the N+ first well;
- the other of the source- and drain wells is a P+ second well has including a channel second boundary that is also to the right of the symmetry line;
- a dielectric first liner disposed in the gate electrode recess; and
- a metal second liner disposed in the gate electrode recess, wherein the dielectric first liner holds the metal second liner, and wherein metal second liner holds the gate electrode.

31. The transistor of claim 24, further including:
- one of the source- and drain wells is an N+ first well including a channel first boundary that is to the left of the symmetry line;
- the other of the source- and drain wells is a P+ second well including a channel second boundary that is to the right of the symmetry line;
- a dielectric first liner disposed in the gate electrode recess; and
- a metal second liner disposed in the gate electrode recess, wherein the dielectric first liner holds the metal second liner, and wherein metal second liner holds the gate electrode.

* * * * *